(12) United States Patent
Tseng et al.

(10) Patent No.: US 8,461,005 B2
(45) Date of Patent: Jun. 11, 2013

(54) METHOD OF MANUFACTURING DOPING PATTERNS

(75) Inventors: Huan-Ting Tseng, Kao-Hsiung Hsien (TW); Chun-Hsien Huang, Tainan County (TW); Hung-Chin Huang, Tainan (TW); Chen-Wei Lee, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 605 days.

(21) Appl. No.: 12/716,277

(22) Filed: Mar. 3, 2010

(65) Prior Publication Data

US 2011/0217821 A1  Sep. 8, 2011

(51) Int. Cl.
*H01L 21/8234* (2006.01)

(52) U.S. Cl.
USPC ........... 438/275; 438/552; 438/553; 438/555; 438/377; 438/546; 438/448; 438/942; 257/275; 257/390

(58) Field of Classification Search
USPC ................. 438/275, 377, 546, 448, 552, 553, 438/555, 942; 257/390
See application file for complete search history.

(56) References Cited

U.S. PATENT DOCUMENTS

| | | | | |
|---|---|---|---|---|
| 5,296,393 A * | 3/1994 | Smayling et al. | | 438/275 |
| 5,691,213 A * | 11/1997 | Chang et al. | | 438/275 |
| 5,733,795 A * | 3/1998 | Spinella et al. | | 438/130 |
| 6,110,782 A * | 8/2000 | Chu et al. | | 438/275 |
| 6,165,870 A * | 12/2000 | Shim et al. | | 438/424 |
| 6,221,722 B1 * | 4/2001 | Lee | | 438/275 |
| 6,329,233 B1 * | 12/2001 | Pan et al. | | 438/199 |
| 6,355,530 B1 * | 3/2002 | Ho et al. | | 438/276 |
| 6,403,425 B1 * | 6/2002 | Ang et al. | | 438/283 |
| 6,465,768 B1 * | 10/2002 | Ker et al. | | 250/214.1 |
| 6,468,849 B1 * | 10/2002 | Efland et al. | | 438/200 |
| 6,468,869 B1 * | 10/2002 | Yang et al. | | 438/278 |
| 6,509,243 B2 * | 1/2003 | Fan | | 438/369 |
| 6,545,318 B1 * | 4/2003 | Kunikiyo | | 257/349 |
| 6,586,303 B2 * | 7/2003 | Wu | | 438/262 |
| 6,613,655 B2 * | 9/2003 | Chien et al. | | 438/551 |
| 6,620,693 B2 * | 9/2003 | Lai et al. | | 438/275 |
| 6,713,821 B2 * | 3/2004 | Fan et al. | | 257/390 |
| 6,723,605 B1 * | 4/2004 | Erhardt et al. | | 438/258 |
| 6,734,064 B2 * | 5/2004 | Yang et al. | | 438/257 |
| 6,803,285 B2 * | 10/2004 | Mistry et al. | | 438/276 |
| 6,823,231 B1 * | 11/2004 | Bode et al. | | 700/121 |
| 6,825,545 B2 * | 11/2004 | Nasr | | 257/532 |
| 6,835,622 B2 * | 12/2004 | Yeh et al. | | 438/275 |
| 7,045,436 B2 * | 5/2006 | Chatterjee et al. | | 438/433 |
| 7,326,601 B2 * | 2/2008 | Wirbeleit et al. | | 438/151 |
| 7,553,727 B2 * | 6/2009 | Kwan et al. | | 438/257 |
| 7,572,690 B2 * | 8/2009 | Hwang | | 438/197 |
| 7,588,986 B2 * | 9/2009 | Jung | | 438/275 |
| 7,615,386 B2 * | 11/2009 | Anderson | | 438/6 |
| 7,687,385 B2 * | 3/2010 | Matsuzaki et al. | | 438/552 |
| 7,713,825 B2 * | 5/2010 | Hu et al. | | 438/279 |

(Continued)

*Primary Examiner* — Allan R Wilson
*Assistant Examiner* — Mohammed Shamsuzzaman
(74) *Attorney, Agent, or Firm* — Winston Hsu; Scott Margo (57) ABSTRACT

A method of manufacturing doping patterns includes providing a substrate having a plurality of STIs defining and electrically isolating a plurality of active regions in the substrate, forming a patterned photoresist having a plurality of exposing regions for exposing the active regions and the STIs in between the active regions on the substrate, and performing an ion implantation to form a plurality of doping patterns in the active regions.

7 Claims, 8 Drawing Sheets

U.S. PATENT DOCUMENTS

| | | | |
|---|---|---|---|
| 7,951,662 B2 * | 5/2011 | Hsieh | 438/199 |
| 8,080,485 B2 * | 12/2011 | Anderson et al. | 438/799 |
| 8,151,221 B2 * | 4/2012 | Huang et al. | 716/53 |
| 8,247,280 B2 * | 8/2012 | Sonsky et al. | 438/199 |
| 2002/0015898 A1 * | 2/2002 | Sung et al. | 430/5 |
| 2003/0032231 A1 * | 2/2003 | Efland et al. | 438/200 |
| 2003/0224589 A1 * | 12/2003 | Endo et al. | 438/552 |
| 2003/0232473 A1 * | 12/2003 | Yeh et al. | 438/275 |
| 2004/0067619 A1 * | 4/2004 | Niimi et al. | 438/275 |
| 2004/0195621 A1 * | 10/2004 | Nasr | 257/347 |
| 2006/0008977 A1 * | 1/2006 | Tran | 438/239 |
| 2006/0024910 A1 * | 2/2006 | Chatterjee et al. | 438/424 |
| 2007/0122963 A1 * | 5/2007 | Chen et al. | 438/202 |
| 2007/0298579 A1 * | 12/2007 | Hu et al. | 438/377 |
| 2008/0150006 A1 * | 6/2008 | Kwan et al. | 257/324 |
| 2008/0286928 A1 * | 11/2008 | Minami | 438/275 |
| 2009/0011561 A1 * | 1/2009 | Chen | 438/275 |
| 2009/0053899 A1 * | 2/2009 | Liu et al. | 438/703 |
| 2009/0283826 A1 * | 11/2009 | Shea et al. | 257/336 |
| 2010/0015771 A1 * | 1/2010 | Hsieh | 438/275 |
| 2010/0127337 A1 * | 5/2010 | Kuo et al. | 257/393 |
| 2010/0151391 A1 * | 6/2010 | Neogi et al. | 430/311 |
| 2011/0089498 A1 * | 4/2011 | Sonsky et al. | 257/392 |
| 2011/0117713 A1 * | 5/2011 | Park et al. | 438/287 |
| 2011/0129781 A1 * | 6/2011 | Kim et al. | 430/323 |
| 2011/0193161 A1 * | 8/2011 | Zhu et al. | 257/343 |
| 2012/0034755 A1 * | 2/2012 | Wang et al. | 438/424 |
| 2012/0108020 A1 * | 5/2012 | Baldwin et al. | 438/210 |
| 2012/0108021 A1 * | 5/2012 | Mehrotra | 438/231 |
| 2012/0119265 A1 * | 5/2012 | Su et al. | 257/288 |

* cited by examiner

METHOD OF MANUFACTURING DOPING PATTERNS

BACKGROUND OF THE INVENTION

1. Field of the Invention

The present invention relates to a method of manufacturing doping patterns, and more particularly, to a method of manufacturing doping patterns of semiconductor devices.

2. Description of the Prior Art

With the progress of highly-integrated ICs and device miniaturization, critical dimension of semiconductor device and width of shallow trench isolation (STI), which provides electrical isolation between the semiconductor devices, are subsequently decreased. And thus the semiconductor fabricating process such as the photolithography process has been challenged.

It is well-known the ICs are multi-layered structure constructed by different device patterns, which are defined by photolithography processes. Therefore, the photolithography process is always taken as one of the critical processes among the semiconductor techniques. With the progress of device miniaturization, the two essential elements of the photolithography process: photomask and photoresist are respectively challenged. The photomask has to face the problem of alignment while the photoresist has to face the problem between the material and the process. It is found that the patterned photoresists easily collapse due to the inferior adhesion. Therefore, ion implantation results are adversely affected, and thus production yield and process window are deteriorated. Such problem is found not only in the ion implantations for adjusting the $V_{tn}$ and the $V_{tp}$, but also in the ion implantations for forming the NLDD, PLDD, the source/drain of NMOS and PMOS transistors. Therefore, a method for manufacturing doping patterns that is able to avoid above-mentioned problems is still in need.

SUMMARY OF THE INVENTION

It is an object of the present invention to provide a method for manufacturing doping patterns able to avoid inferior ion implantation result due to the inferior adhesion of the photoresist to the STI.

According to the claimed invention, a method of manufacturing doping patterns is provided. The method first provides a substrate having a plurality of STIs formed therein. The STIs define and electrically isolate a plurality of active regions having a same polarity. Then, a patterned photoresist having a plurality of exposing regions for exposing the active regions and the STIs in between the active regions is formed on the substrate, and followed by performing an ion implantation to form a plurality of doping patterns in the active regions through the patterned photoresist.

According to the claimed invention, another method of manufacturing doping patterns is provided. The method first provides a substrate having a plurality of STIs formed therein. The STIs define and electrically isolate a plurality of active regions having a same polarity. Then, a plurality of first conductive layer patterns are formed in the active regions and a plurality of second conductive layer patterns are formed on a portion of the STIs by a conductive layer defining pattern. Next, a patterned photoresist having a plurality of exposing regions for exposing the active regions, the first conductive layer patterns and a portion of the STIs in between the active regions is formed on the substrate and followed by performing an ion implantation to form a plurality of doping patterns in the active regions through the patterned photoresist.

According to the claimed invention, still a method of manufacturing an implantation photomask is provided. The method first provides a predetermined doping pattern and a STI defining pattern. The predetermined doping pattern further comprises a plurality of first dope-blocking regions and a plurality of first dope-exposing regions. Then, the predetermined doping pattern is modified with the STI defining pattern to form a modified doping pattern, and followed by outputting the modified doping pattern on a photomask.

According to the method of manufacturing doping patterns provided by the present invention, the patterned photoresist is formed intentionally not upon the STI in between the active regions having a same polarity through the modified doping pattern. Therefore, collapse of the photoresist due to its inferior adhesion to the STI, and the adverse affect to the following ion implantation are both prevented.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
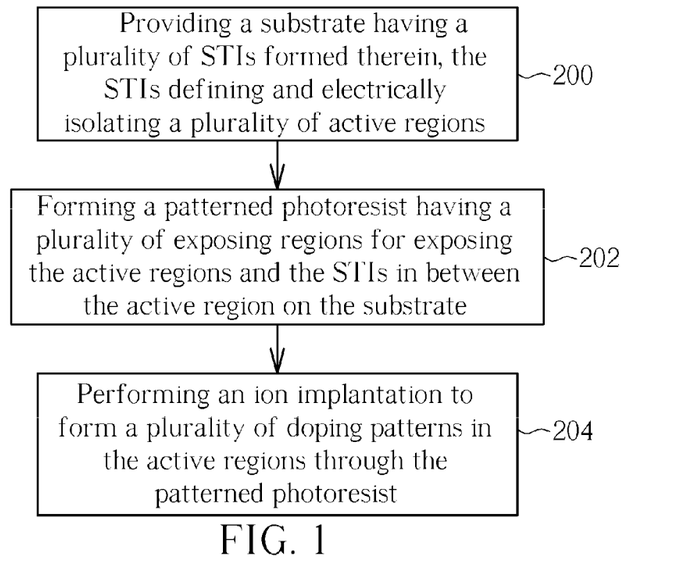
FIG. 1 and FIG. 2 are flowcharts of a method of manufacturing doping patterns provided by a first preferred embodiment of the present invention.

Please refer to FIGS. 1-6, FIG. 1 and FIG. 2 are flowcharts of a method of manufacturing doping patterns provided by a first preferred embodiment of the present invention; and FIGS. 3-6 are drawings illustrating the method of manufacturing doping patterns provided by the first preferred embodiment. As shown in FIG. 1, Step 200 is first performed:

Step 200: Providing a substrate having a plurality of STIs formed therein, the STIs defining and electrically isolating a plurality of active regions.

Figure 3:
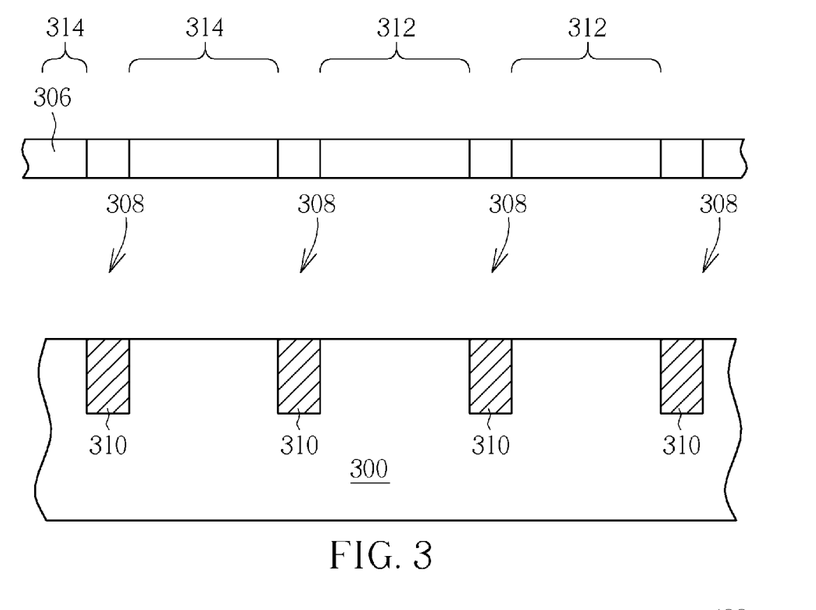
FIGS. 3-6 are drawings illustrating the method of manufacturing doping patterns provided by the first preferred embodiment.

Please refer to FIG. 3. In the first preferred embodiment, a substrate 300 such as a silicon substrate or silicon-on-insulator (SOI) substrate is provided. A STI defining photomask having a STI defining pattern 306 is then provided. Next, a photolithography process is performed to transfer the STI defining pattern 306 to define a plurality of STI regions 308 on the substrate 300. Since steps of performing the photolithography process and the required photoresist and hard mask are well-known to those skilled in the art, those details are omitted herein in the interest of brevity. Then, an etching process is performed to etch the STI regions 308, and thus a plurality of shallow trenches (not shown) are formed in the substrate 300. The shallow trenches are filled with insulating material such as silicon oxide to form a plurality of STIs 310 is formed as shown in FIG. 3. The STIs 310 are used to define a plurality of first active regions 312 and a plurality of second active regions 314, and provide electrical isolation. The first active regions 312 are exemplarily NMOS transistor active regions and the second active regions 314 are exemplarily PMOS transistor active regions.

Step 202: Forming a patterned photoresist having a plurality of exposing regions for exposing the active regions and the STIs in between the active region on the substrate.

Figure 2:
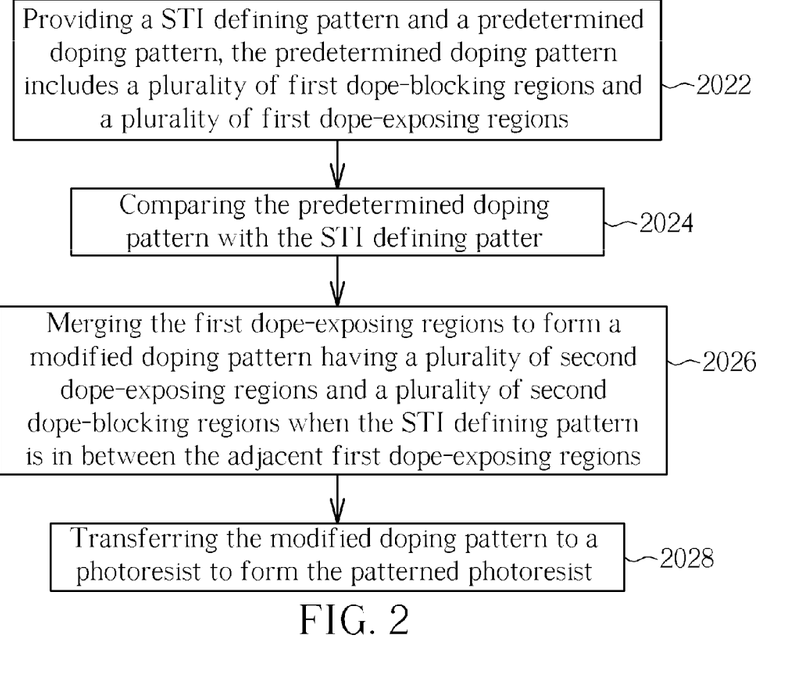

The patterned photoresist mentioned in Step 202 is formed by transferring a modified doping pattern formed on an implantation photomask, and steps for forming the modified doping pattern and the implantation photomask are shown in FIG. 2. In the first preferred embodiment, steps for forming the implantation photomask include:

Step 2022: Providing a STI defining pattern and a predetermined doping pattern, the predetermined doping pattern includes a plurality of first dope-blocking regions and a plurality of first dope-exposing regions.

Figure 4:
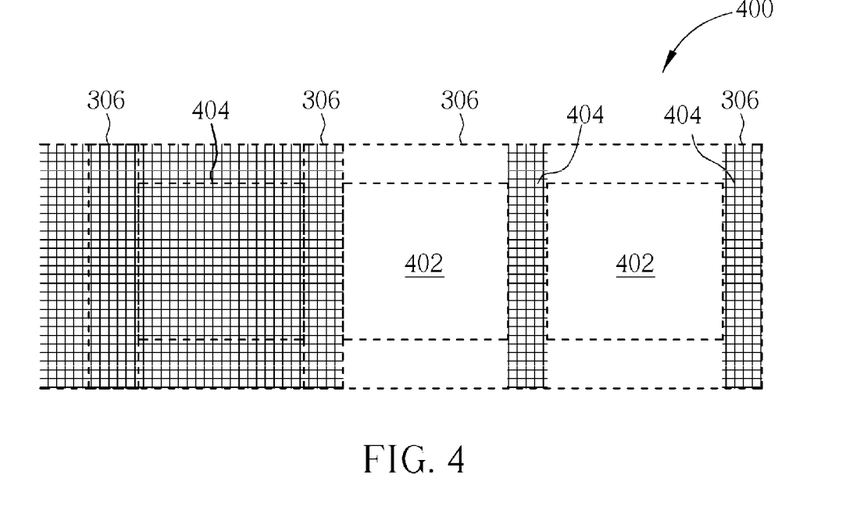

Please refer to FIG. 4. The predetermined doping pattern 400 can be a conventional doping pattern used in the ion implantation for adjusting $V_{tn}$ of the NMOS transistor, and the STI defining pattern can be the STI defining pattern 306 for defining STI regions 308 as mentioned above. The predetermined doping pattern 400 comprises a plurality of first dope-exposing regions 402 and a plurality of first dope-blocking regions 404. The predetermined doping pattern 400 is a pattern designed in a computer but not outputted. According to the designed pattern, the first dope-exposing regions 402 are corresponding to the first active regions 312 while the first dope-blocking regions 404 are corresponding to all of the STIs 310 and the second active regions 314.

Step 2024: Comparing the predetermined doping pattern with the STI defining pattern.

Step 2026: Merging the first dope-exposing regions to form a modified doping pattern having a plurality of second dope-exposing regions and a plurality of second dope-blocking regions when the STI defining pattern is in between the adjacent first dope-exposing regions.

Figure 5:
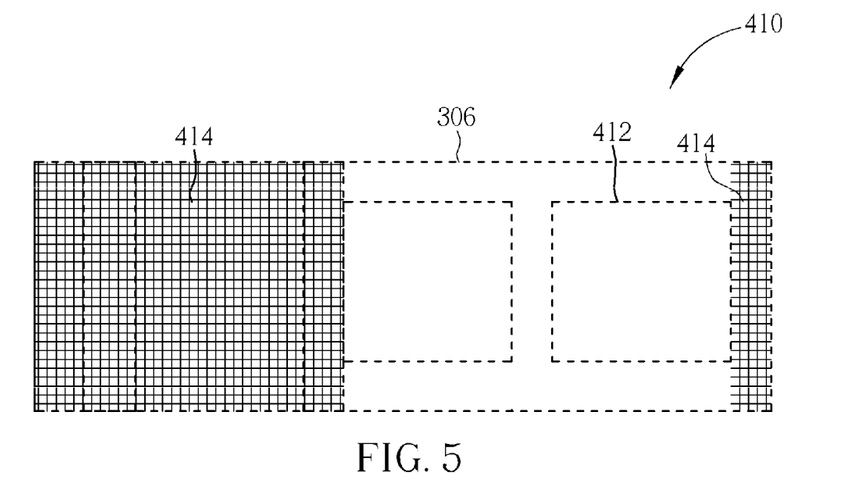

Comparing the predetermined doping pattern 400 with the STI defining pattern 306. When the STI defining pattern 306 is overlapping the first dope-blocking region 404 in between the adjacent first dope-exposing regions 402, an optical proximity correction (OPC) is performed to delete the first dope-blocking region 404 that is overlapping the STI defining pattern 306, and to merge the adjacent first dope-exposing regions 402. Thus a plurality of second dope-exposing regions 412 are formed as shown in FIG. 5. In the mean time, a plurality of second dope-blocking regions 414 corresponding to the second active regions 314, and to the STIs 310 between the first active region 312 and the second active region 314 are formed. Accordingly, a modified doping pattern 410 including the second dope-exposing regions 412 and the second dope-blocking regions 414 is obtained.

Step 2028: Transferring the modified doping pattern to a photoresist to form the patterned photoresist.

Figure 6:
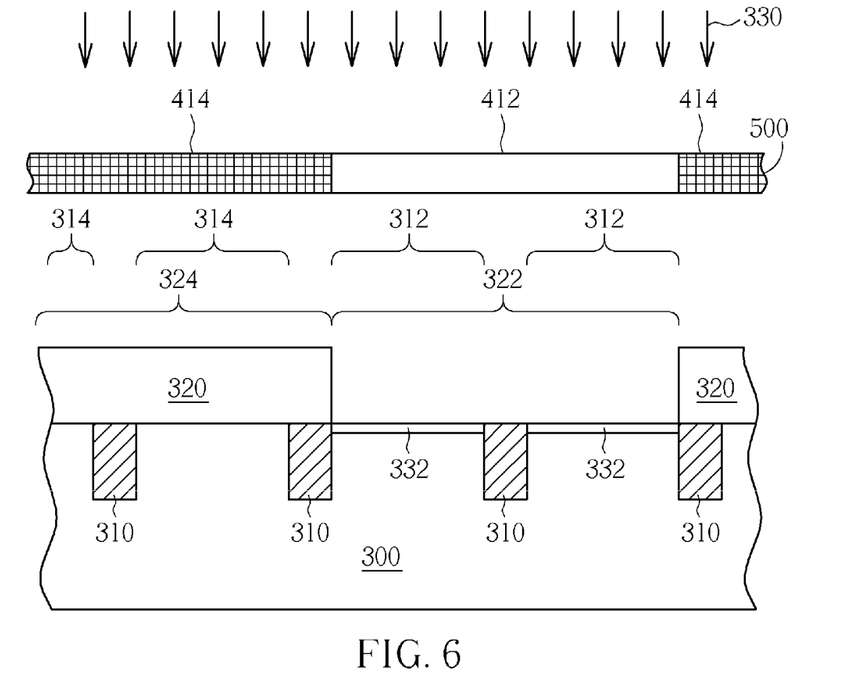

Please refer to FIG. 6. The modified doping pattern 410 is outputted and formed in an implantation photomask 500. Thus steps for manufacturing the implantation photomask 500 are completed. Then, the modified doping pattern 410 formed on the implantation photomask 500 is transferred to a photoresist on the substrate 300 by performing a photolithography process to form the patterned photoresist 320 as described in Step 202. As mentioned above, the patterned photoresist 320 includes a plurality of exposing regions 322 and a plurality of blocking regions 324. The exposing regions 322 are respectively corresponding to the second dope-exposing regions 412 of the modified doping pattern 410. Furthermore, the exposing regions 322 expose the first active regions 312 and the STI 310 in between the adjacent first active regions 312. The blocking regions 324 are respectively corresponding to the second dope-blocking regions 414 of the modified doping pattern 410. Furthermore, the blocking regions 324 cover the second active regions 314, and the STI 310 in between the first active region 312 and the second active region 314. After forming the patterned photoresist 320, Step 204 is performed:

Step 204: Performing an ion implantation to form a plurality of doping patterns in the active regions through the patterned photoresist.

Please still refer to FIG. 6. An ion implantation 330, such as an n-type ion implantation for adjusting $V_{tn}$ of the NMOS transistor, is performed. Thus, a plurality of active region doping patterns, such as N-type doping patterns 332 are formed in the first active regions 312. Additionally, another photomask and patterned photoresist (not shown) can be prepared by the steps as mentioned above to form p-type doping patterns 334 (shown in FIG. 9) for adjusting $V_{tp}$ of the PMOS transistor.

Because the material used to form the STIs 310 is able to block the dopants from entering the substrate 300, the STIs 310 are directly used to be the mask in the ion implantation. Therefore, no blocking regions are needed on the STIs 310 in between the adjacent first active regions 312 having the same electrical requirements in the first preferred embodiment. According to the method provided by the first preferred embodiment, the patterned photoresist 320 is not formed upon the STIs 310 in between the adjacent first active regions 312, and collapse due to its inferior adhesion to the STI is prevented, even the critical dimension of semiconductor device keeps on shrinking and the aspect ratio of the patterned photoresist 320 keeps on increasing.

Please refer to FIGS. 7-13, FIG. 7 and FIG. 8 are flowcharts of a method of manufacturing doping patterns provided by a second preferred embodiment of the present invention; and FIGS. 9-13 are drawings illustrating the method of manufacturing doping patterns provided by the second preferred embodiment. Please note that the same elements in both of the first and second preferred embodiments are depicted by the same numerals.

Figure 7:
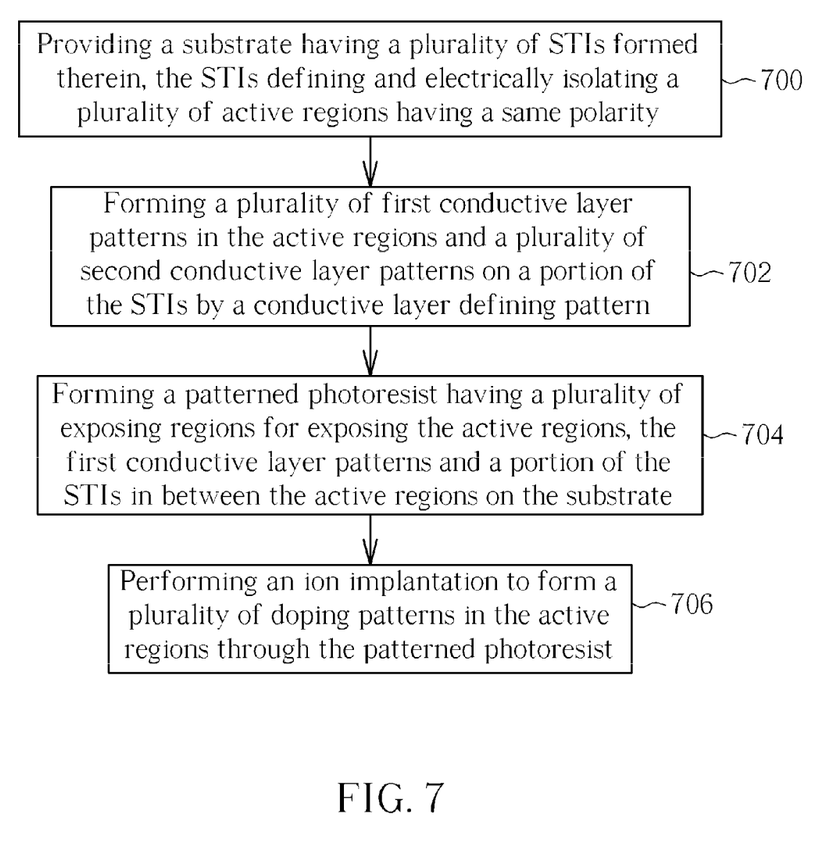
FIG. 7 and FIG. 8 are flowcharts of a method of manufacturing doping patterns provided by a second preferred embodiment of the present invention.

As shown in FIG. 7, Step 700 and Step 702 are first performed:

Step 700: Providing a substrate having a plurality of STIs formed therein, the STIs defining and electrically isolating a plurality of active regions having a same polarity.

Figure 9:
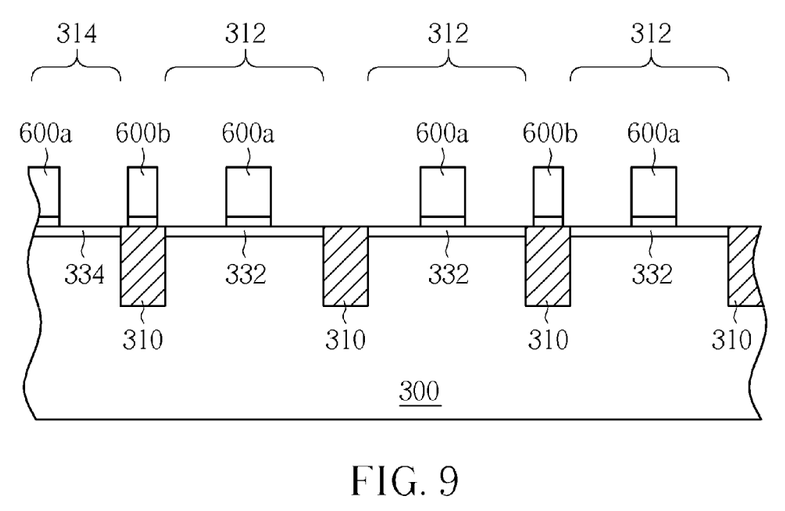
FIGS. 9-13 are drawings illustrating the method of manufacturing doping patterns provided by the second preferred embodiment.

As shown in FIG. 9, a plurality of STIs 310 and a plurality of first active regions 312 and second active regions 314 defined by the STIs 310 are formed in the substrate 300. Since steps for forming the STIs 310 are similar to that described in the first preferred embodiment, those details are omitted herein. Next, the n-type doping patterns 332 and the p-type doping patterns 334 are respectively formed to adjust $V_{tn}$ of NMOS transistor and $V_{tp}$ of the PMOS transistor in the first active regions 312 and the second active regions 314 according to the method disclosed in the first preferred embodiment.

Step 702: Forming a plurality of first conductive layer patterns in the active regions and a plurality of second conductive layer patterns on a portion of the STIs by a conductive layer defining pattern.

Please still refer to FIG. 9. A conductive layer defining pattern 600 (shown in FIG. 10) is provided to form a plurality of first conductive layer patterns 600a such as gate patterns in the first active regions 312 and the second active regions 314, and a plurality of second conductive layer patterns 600b such as resistor patterns on a portion of the STIs 310. However, the first conductive layer patterns 600a and the second conductive layer patterns 600b are not limited to be the gate patterns and the resistor patterns as mentioned above. Nest, Step 704 is performed:

Step 704: Forming a patterned photoresist having a plurality of exposing regions for exposing the active regions, the first conductive layer patterns and a portion of the STIs in between the active regions on the substrate.

Figure 8:
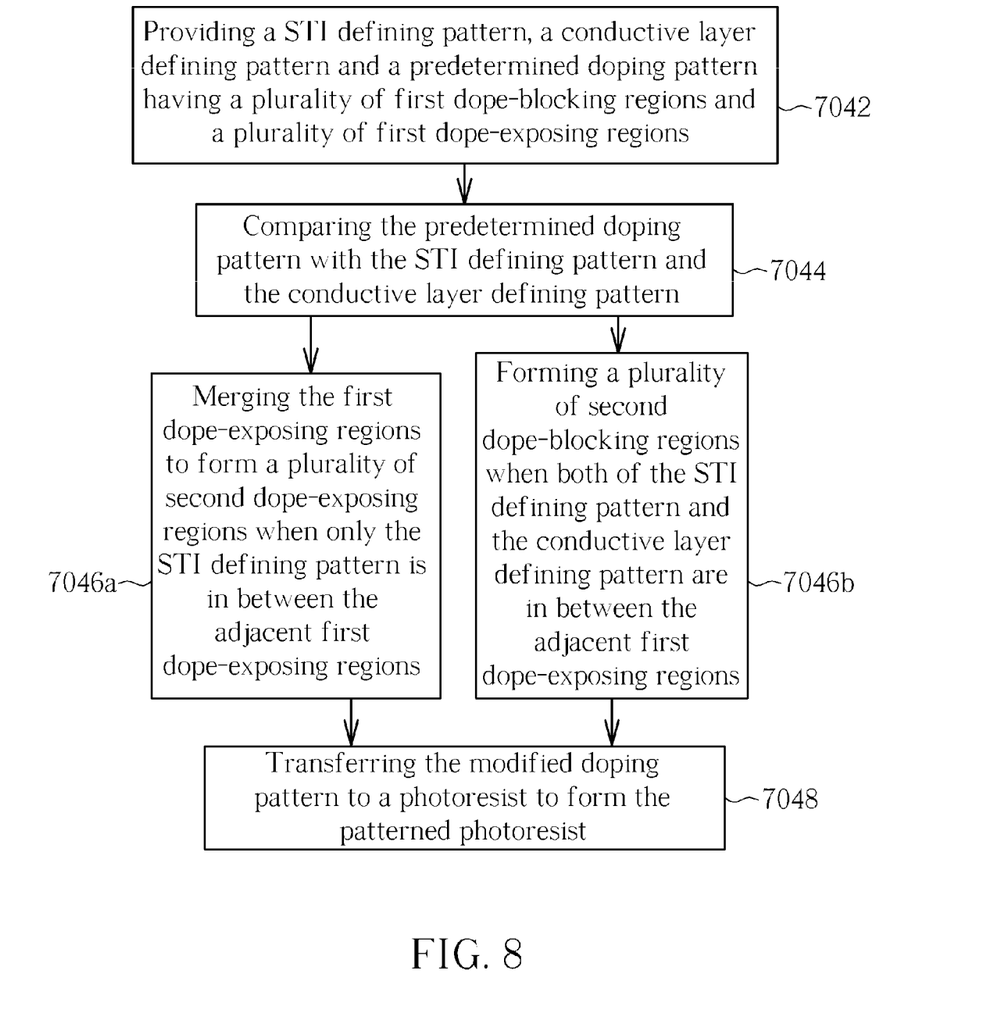

It is noteworthy that the patterned photoresist of Step 704 is formed by transferring a modified doping pattern formed in an implantation photomask, and steps for forming the modified doping pattern and the implantation photomask are shown in FIG. 8. In the second preferred embodiment, steps for forming the implantation photomask include:

Step 7042: Providing a STI defining pattern, conductive layer defining pattern and a predetermined doping pattern having a plurality of first dope-blocking regions and a plurality of first dope-exposing regions.

Figure 10:
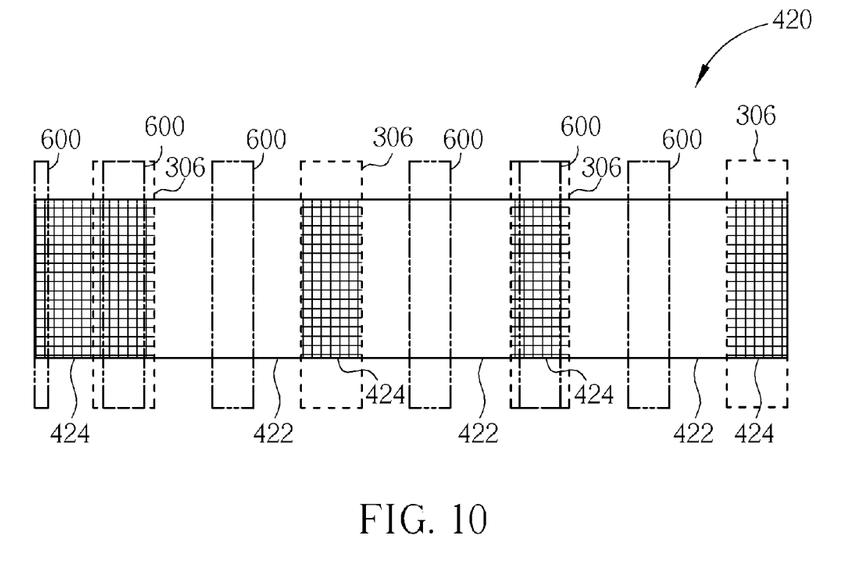

Please refer to FIG. 10. The STI defining pattern can be the STI defining pattern 306 for defining STI regions 308 as mentioned above. The conductive layer defining pattern can be the conductive layer defining pattern 600 used to form the first conductive layer patterns 600a and the second conductive layer patterns 600b. And the predetermined doping pattern 420 can be a conventional doping pattern used in the ion implantation for forming the LDD and the source/drain of the NMOS transistor. The predetermined doping pattern 420 includes a plurality of first dope-exposing regions 422 and a plurality of first dope-blocking regions 424. The predetermined doping pattern 400 is a pattern designed in a computer but not outputted. According to the designed pattern, the first dope-exposing regions 422 are corresponding to the first active regions 312 while the first dope-blocking regions 424 are corresponding to the second active regions 314 and all of the STIs 310.

Step 7044: Comparing the predetermined doping pattern with the STI defining pattern and the conductive layer defining pattern.

Step 7046a: Merging the first dope-exposing regions to form a plurality of second dope-exposing regions when only the STI defining pattern is in between the adjacent first dope-exposing regions.

Step 7046b: Forming a plurality of second dope-blocking regions when both of the STI defining pattern and the conductive layer defining pattern are in between the adjacent first dope-exposing regions.

Figure 11:
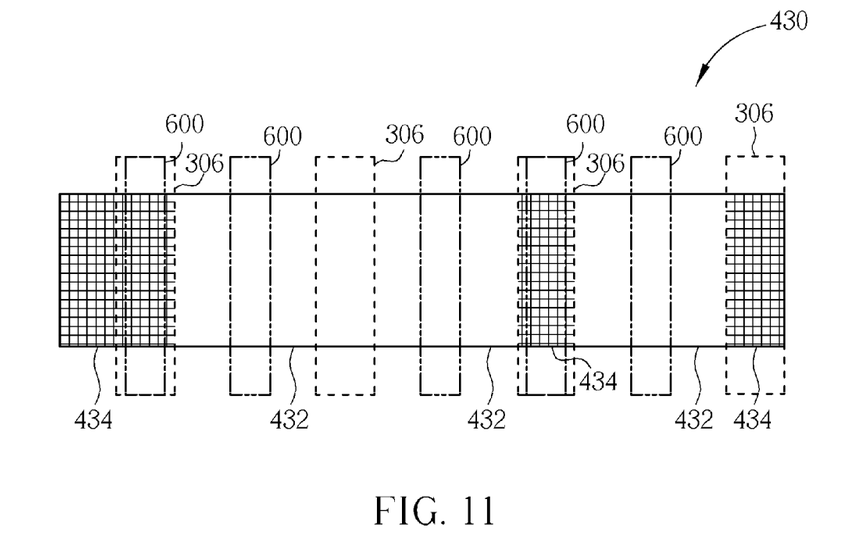

Please refer to FIG. 10 and FIG. 11. Comparing the predetermined doping pattern 420 with the STI defining pattern 306 and the conductive layer defining pattern 600. When only the STI defining patterns 306 are overlapping the first dope-blocking regions 424 in between the adjacent first dope-exposing regions 422, an OPC is performed to merge the first dope-exposing regions 422 to form a plurality of second dope-exposing regions 432. It is noteworthy that when both of the STI defining patterns 306 and the conductive layer defining pattern 600 are overlapping the first dope-blocking region 424 in between the adjacent first dope-exposing regions 422, a plurality of second dope-blocking regions 434 are correspondingly formed. Furthermore, the second dope-blocking regions 434 are also formed corresponding to the second active regions 314 and the STIs 310 in between the first active region 312 and the second active region 314.

Step 7048: Transferring the modified doping pattern to a photoresist to form the patterned photoresist.

Figure 12:
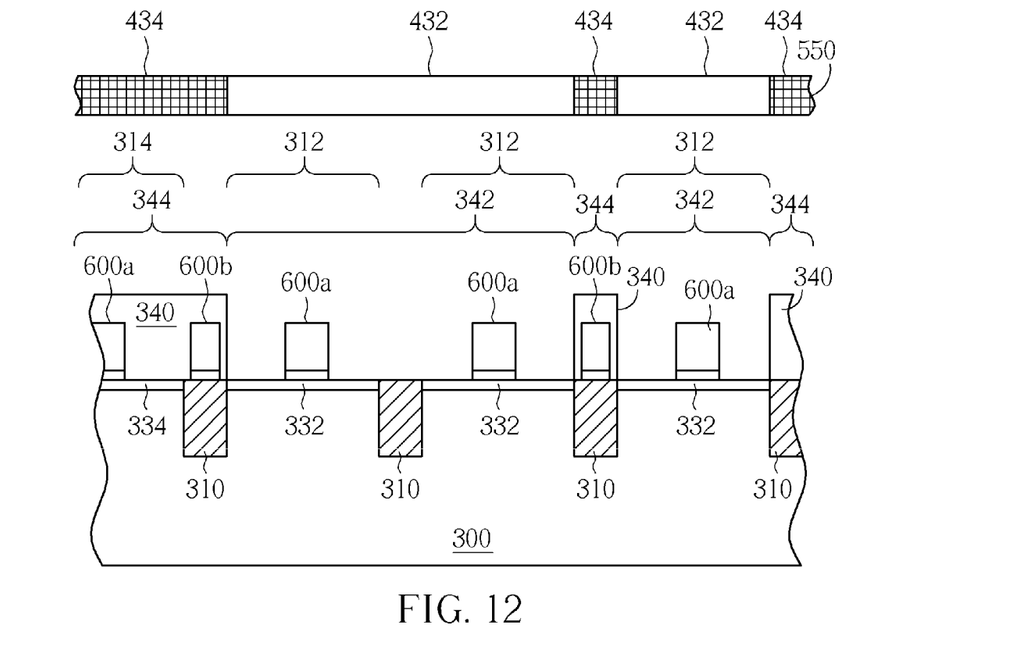

Next, the modified doping pattern 430 having the second dope-exposing regions 432 and the second dope-blocking regions 434 are outputted and formed in an implantation photomask 550 (shown in FIG. 12). Thus steps for manufacturing the implantation photomask 550 are completed. Please refer to FIG. 12. Then, a photoresist is formed on the substrate 300, and a photolithography process is performed to transfer the modified doping pattern 430 of the implantation photomask 550 to the photoresist. Consequently, the patterned photoresist 340 as described in Step 704 is obtained. The patterned photoresist 340 includes a plurality of exposing regions 342 and a plurality of blocking regions 344. The exposing regions 342 are respectively corresponding to the second dope-exposing regions 432 of the modified doping pattern 430. Furthermore, the exposing regions 342 expose the first active regions 312, the first conductive layer patterns 600a in the first active regions 312, and the STI 310 in the adjacent first active regions 312 having no second conductive layer pattern 600b formed upon. The blocking regions 344 are respectively corresponding to the second dope-blocking regions 434 of the modified doping pattern 430. Furthermore, the blocking regions 344 cover the second active regions 314, the STI 310 in between the first active regions 312 and the second active region 314, and the STI 310 in between the adjacent first active regions 312 having the second conductive layer pattern 600b formed upon. After forming the patterned photoresist 340, Step 706 is performed:

Step 706: Performing an ion implantation to form a plurality of doping patterns in the active regions through the patterned photoresist.

Figure 13:
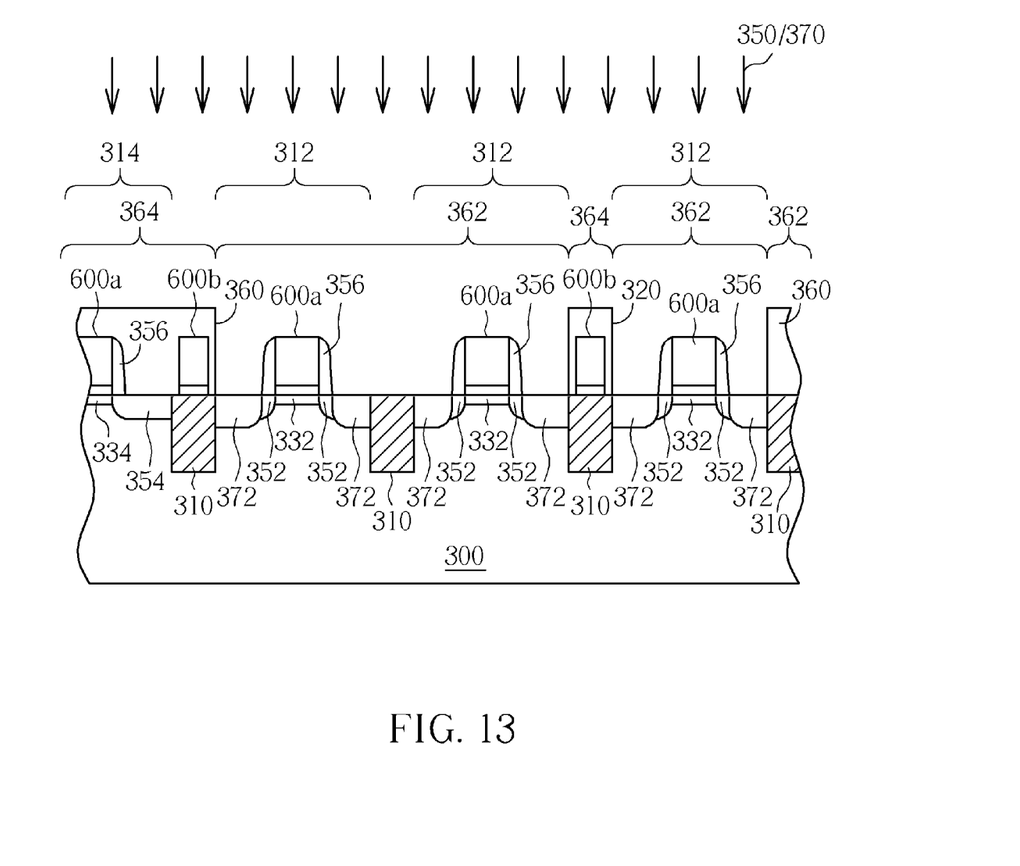

Please refer to FIG. 13. Then, an ion implantation 350, such as an n-type ion implantation for forming the LDD of the NMOS transistor is performed to form a plurality of doping patterns 352 serving as the NLDDs in the first active regions 312 through the patterned photoresist 340. Additionally, another photomask and patterned photoresist can be prepared by the steps as mention above to form doping patterns 334 serving as PLDDs of the PMOS transistors.

Please still refer to FIG. 13. After sequentially forming the LDDs 352 of the NMOS transistors, the LDDs 354 of the PMOS transistors and the spacers 356, the implantation photomask 550 is used again to form a patterned photoresist 360 on the substrate 300. The patterned photoresist 360 includes a plurality of exposing regions 362 and a plurality of blocking regions 364. The exposing regions 362 and the blocking regions 364 are respectively corresponding to regions similar with the exposing regions 342 and the blocking region 344 of the patterned photoresist 340. After forming the patterned photoresist 360, an ion implantation 370 is performed as described in Step 706 to form doping patterns 372 serving as source/drain of the NMOS transistor in the first active regions 312 through the patterned photoresist 360. Additionally, another photomask and patterned photoresist can be prepared by the steps as mention above to form p-type doping patterns (not shown) serving as source/drain of the PMOS transistor.

Because the material used to form the STIs 310 is able to block the dopants from entering the substrate 300, the STIs 310 are directly used to be the mask in the ion implantation 350/370. Therefore, whether the second conductive layer pattern 600b is overlapping to the STI 310 or not decides the formation the blocking regions 344/364 of the pattern photoresist 340/306: no blocking regions 344/364 are needed on the STIs 310 in between the adjacent first active regions 312 when no second conductive layer pattern 600b is formed upon on the STI 310. Thus the patterned photoresist 340/360 is prevented from collapse due to its inferior adhesion to the STI 310. But when the second conductive layer pattern 600b is formed upon the STI 310 in between the adjacent first active regions 312, the patterned photoresist 340/360 is still needed to block the dopants from entering the conductive layers.

According to the method of manufacturing doping patterns provided by the present invention, the patterned photoresist is formed intentionally not on the STI in between the active regions having a same polarity through the modified doping pattern. Therefore, collapse of the photoresist due to its inferior adhesion to the STI, and the adverse affect to the following ion implantation are both prevented.

Those skilled in the art will readily observe that numerous modifications and alterations of the device and method may be made while retaining the teachings of the invention.

What is claimed is:

1. A method of manufacturing doping patterns comprising steps of:
    providing a substrate having a plurality of shallow trench isolations (STIs) formed therein, the STIs defining and electrically isolating a plurality of active regions having a same polarity of n-type or p-type, wherein forming the STIs comprises:
    providing a STI defining pattern to define a plurality of STI regions on the substrate; and
    forming the STIs respectively in the STI regions;
    forming a patterned photoresist having a plurality of exposing regions for exposing the active regions and the STIs in between the active regions on the substrate, wherein forming the patterned photoresist comprises:
    providing a predetermined doping pattern having a plurality of first dope-blocking regions and a plurality of first dope-exposing regions;
    comparing the predetermined doping pattern with the STI defining pattern;
    merging the first dope-exposing regions to form a modified doping pattern having a plurality of second dope-exposing regions and a plurality of second dope-blocking regions when the STI defining pattern is in between the adjacent first dope-exposing regions; and
    transferring the modified doping pattern to a photoresist to form the patterned photoresist; and
    performing an ion implantation to form a plurality of doping patterns in the active regions through the patterned photoresist, wherein at least two doping patterns have the same polarity of n-type or p-type are adjacent to and electrically isolated from each other by the STI.

2. The method of claim 1, wherein the modified doping pattern is formed on an implantation photomask.

3. The method of claim 1, wherein the exposing regions of the patterned photoresist are corresponding to the second dope-exposing regions, respectively.

4. The method of claim 1, wherein the patterned photoresist further comprises a plurality of blocking regions respectively corresponding to the second dope-blocking regions of the modified doping pattern.

5. The method of claim 1, wherein the ion implantation comprises an n-type ion implantation or a p-type ion implantation.

6. The method of claim 1, wherein the doping pattern comprises an active region doping pattern.

7. A method of manufacturing an implantation photomask comprising steps of:
    providing a predetermined doping pattern and a STI defining pattern, the predetermined doping pattern further comprising a plurality of first dope-blocking regions and a plurality of first dope-exposing regions;
    modifying the predetermined doping pattern with STI defining pattern to form a modified doping pattern, the step of forming the modified doping pattern further comprising:
    comparing the predetermined doping pattern with the STI defining pattern;
    merging the first dope-exposing regions to form a plurality of second dope-exposing regions when the STI defining pattern is in between the adjacent first dope-exposing regions; and
    forming a plurality of second dope-blocking regions; and
    outputting the modified doping pattern on a photomask.

* * * * *